United States Patent [19]
Siems et al.

[11] Patent Number: 5,618,380
[45] Date of Patent: Apr. 8, 1997

[54] WAFER EDGE SEALING

[75] Inventors: Daniel D. Siems, Boerne; Judy U. Galloway, Fair Oaks; Clayton Lantz, San Antonio, all of Tex.

[73] Assignee: VLSI Technology, Inc., San Jose, Calif.

[21] Appl. No.: 574,069

[22] Filed: Dec. 18, 1995

[51] Int. Cl.⁶ ................................................ H01L 21/00
[52] U.S. Cl. ........................... 438/14; 438/703; 438/761
[58] Field of Search ........................... 156/626.1, 633.1, 156/657.1, 659.11, 656.1; 216/33, 41, 75, 100

[56] References Cited

PUBLICATIONS

Hause et al., "Yield Improvement by Wafer Edge Engineering", SPIE vol. 2635, at 22–29, Aug. 1995.

*Primary Examiner*—William Powell
*Attorney, Agent, or Firm*—Wagner, Murabito & Hao

[57] ABSTRACT

A method and process for reducing edge-related defects. The present invention comprises the steps of calibrating multiple process units such that the multiple process units are equally referenced with respect to an edge of a semiconductor wafer. The calibrated multiple process units are then utilized to precisely control respective termination distances of deposited substrate layers with respect to the edge of the semiconductor wafer. Furthermore, the deposited substrate layers are selectively stacked in manner which prevents semiconductor wafer edge-related defects. In so doing, the present claimed invention increases semiconductor device yields.

20 Claims, 5 Drawing Sheets

WAFER EDGE SEALING

TECHNICAL FIELD

The present claimed invention relates to the field of semiconductor device fabrication. More specifically, the present claimed invention relates to semiconductor device fabrication occurring near the edge of a semiconductor wafer.

BACKGROUND ART

During conventional applications of photoresist coatings to semiconductor wafers, a "coater" system is used. One part of the coater system is a flat, circular, disk-shaped, rotating vacuum chuck having a diameter slightly less than that of a semiconductor wafer. The vacuum chuck is used to hold and rotate a semiconductor wafer during the photoresist application process. The vacuum chuck is oriented such that a semiconductor wafer placed thereon resides in a level horizontal plane. In operation, the bottom or inactive surface of a semiconductor wafer is placed onto the vacuum chuck. The vacuum chuck applies a suction or negative pressure to the bottom surface of the semiconductor wafer to hold the semiconductor wafer on the vacuum chuck.

Commonly, a desired amount of liquid photoresist is applied to the top upwardly-facing surface of the semiconductor wafer while the semiconductor wafer is being rotated on the vacuum chuck. Thus, as the semiconductor wafer is rotating, the photoresist material spreads radially outward from the center of the semiconductor wafer towards the edge of the semiconductor wafer such that the entire top or active surface of the wafer is coated with a layer of photoresist. Excess photoresist material is sloughed off of the wafer during the rotation process.

However, excess amounts of photoresist tend to accumulate and form a mound or bead of photoresist on the outer edge of the semiconductor wafer. In order to eliminate the "edge bead" of photoresist, an edge bead removal unit is employed. Two types of edge bead removal units are well known in the art, chemical and optical. In a chemical edge bead removal unit, a nozzle dispenses a solvent referred to as edge bead removal fluid onto the photoresist at the edge of the semiconductor wafer. The solvent dissolves the photoresist and allows for easy removal of the photoresist from the edge of the semiconductor wafer. In an optical edge bead removal unit, the photoresist at or near the edge of the semiconductor wafer is exposed to light. During subsequent development processes, the exposed photoresist is removed. Photoresist which remains on the semiconductor wafer or overlying substrates forms a mask for subsequent processing operations. Unfortunately, prior art processes commonly inadvertently remove too much photoresist from the edge of the semiconductor wafer thereby exposing substrate layers to undesirable etching operations.

In the prior art, several edge bead removal units are utilized during fabrication of integrated circuit devices on the semiconductor wafer. The use of different edge bead removal units commonly results in a random or haphazard stacking of substrates layers at the edge of the semiconductor wafer. The randomly or haphazardly stacked substrate layers can lift and detrimentally redeposit onto the semiconductor wafer. The redeposited substrate material contaminates the semiconductor wafer and causes defects in the integrated circuit devices formed on the semiconductor wafer. Also, prior art processes which generate random or haphazard stacking of substrates layers at the edge of the semiconductor wafer often leave certain substrate layers detrimentally exposed to the ambient.

Furthermore, random or haphazard stacking of the substrate layers can also result in having a substrate layer inadvertently placed in contact with an underlying layer to which the overlying layer will not stick. In such an instance, the overlying layer will often peel form the underlying layer and detrimentally redeposit onto the semiconductor wafer. For example, a metal layer placed directly on top of a polysilicon layer will often peel from the polysilicon layer, contaminate the semiconductor wafer, and cause defects in the integrated circuit devices formed on the semiconductor wafer. Thus, it is desired that substrate layers are orderly stacked with overlying layers placed in contact only with underlying layers to which the overlying layers will stick.

Additionally, photoresist must be completely removed from the edge of the semiconductor wafer in order to prevent particulate contamination and subsequent defects. More specifically, a semiconductor wafer is commonly held in place or "clamped" during processing operations such as, for example, etching, sputtering and certain deposition operations. The clamp used to hold the semiconductor wafer in place is applied to the edge of the semiconductor wafer. Likewise, many semiconductor wafer handling devices also contact or clamp the edge of the semiconductor wafer. Because photoresist is a soft material, it tends to stick to clamps or wafer handling equipment, with which it comes into contact. After contacting the clamps or wafer handling equipment, the photoresist can flake off of the clamps or wafer handling equipment and redeposit onto the semiconductor wafer. The redeposited photoresist contaminates the semiconductor wafer and can cause defects in the integrated circuit devices formed on the semiconductor wafer.

In an attempt to avoid contacting the photoresist, prior art methods disclose expanding the region over which edge bead removal is applied. Such an approach is described by Hause et al., "Yield Improvement by Wafer Edge Engineering" SPIE vol. 2635, at 22–29 (August 1995). Such an approach expands the area from which photoresist is removed, thereby reducing the chance that any semiconductor wafer clamping or handling equipment contacts photoresist. However, such an approach reduces semiconductor wafer real estate available for the production of integrated circuit devices.

Thus, the need has arisen for a method or process which allows for an orderly arrangement of substrate layers at or near the edge of a semiconductor wafer thereby preventing undercutting of deposited substrate layers, preventing exposure of the deposited substrate layers to unwanted etching operations, and protectively sealing of the edges of certain deposited substrate layers from the ambient. A further need exists for a method or process which prevents unwanted photoresist contamination of semiconductor wafer clamping and handling equipment without significantly reducing semiconductor wafer real estate.

DISCLOSURE OF THE INVENTION

It is therefore an object of the present invention to provide a method or process which allows for an orderly arrangement of substrate layers at or near the edge of a semiconductor wafer thereby preventing undercutting of deposited substrate layers, preventing exposure of the deposited substrate layers to unwanted etching operations, and protectively sealing of the edges of certain deposited substrate layers from the ambient. It is a further object of the present invention to provide a method or process which prevents unwanted photoresist contamination of semiconductor wafer clamping and handling equipment without significantly reducing semiconductor wafer real estate. The above object has been achieved with a method which includes the steps of calibrating multiple process units such that the multiple process units are equally referenced with respect to an edge of a semiconductor wafer. The calibrated multiple process units are then utilized to precisely control respective termination distances of deposited substrate layers with respect to the edge of the semiconductor wafer. Furthermore, the deposited substrate layers are selectively stacked in manner which prevents semiconductor wafer edge-related defects. In so doing, the present claimed invention increases semiconductor device yields.

Specifically, in one embodiment, the present invention includes the above described steps but also includes calibrating the multiple process units by determining for each of the multiple process units the difference between a location selected for the performance of a process with respect and the actual location at which the process is performed. In the present embodiment, the selected location and the location at which the processes are performed are measured with respect to the edge of the semiconductor wafer.

In another embodiment, the present invention includes the above described steps and further recites that the multiple process units are comprised of edge bead removal units. The edge bead removal units are used to remove photoresist material which is disposed on deposited substrate layers such that the photoresist material is removed a precise specified distance from the edge of the semiconductor wafer. In so doing, the method or process which allows for an orderly arrangement of substrate layers at or near the edge of a semiconductor wafer thereby preventing undercutting of deposited substrate layers, preventing exposure of the deposited substrate layers to unwanted etching operations, and protectively sealing of the edges of certain deposited substrate layers from the ambient.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Figure 1A:
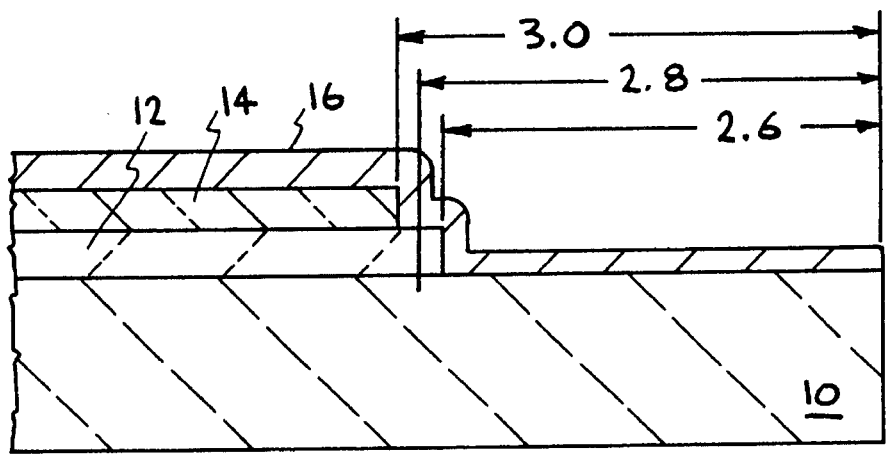
FIGS. 1A–1D are cross sectional views illustrating prior art random or haphazard stacking of substrates layers.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

During the fabrication of integrated circuit devices, numerous substrate layers are deposited over the entire surface of the semiconductor wafer. Commonly, a layer of photoresist material is then applied and spun over the entire surface of each substrate layer. Portions of the photoresist layer are removed from the substrate layer using various processes. The remaining photoresist forms a mask which protects the underlying substrate layer from subsequent processes such as, for example, etching. Thus, the edge bead removal process determines how close to the edge of the semiconductor wafer an underlying substrate layer remains after an etching process. For example, if the edge bead removal process extends inward 3 mm from the edge of the semiconductor wafer, that portion of the underlying substrate layer residing 3 mm from the edge of the semiconductor wafer out to the edge of the semiconductor wafer will no longer have photoresist thereon. During subsequent etching processes the uncovered portion of the underlying substrate layer is removed. Therefore, the remaining underlying substrate layer extends to within 3 mm of the edge of the semiconductor wafer.

Prior Art FIGS. 1A–1D illustrate the random or haphazard stacking of substrates layers associated with prior art fabrication processes. As shown in Prior Art FIG. 1A, a silicon wafer 10 has a polysilicon layer 12, a boro-phospho-silicate-glass (BPSG) layer 14, and a layer of platinum 16 stacked thereon. Typically, several edge bead removal units are used to define the termination distance of the substrate layers. (The termination distance is defined as the distance of the edge of the substrate layer from the edge of the silicon wafer). Due to placement inaccuracies of each edge bead removal unit, and further due to variances between separate edge bead removal units, prior art fabrication processes result in random or haphazard stacking of substrates layers. That is, prior art fabrication processes would intend for polysilicon layer 12 to have a termination distance of 2.8 mm. However, due to placement inaccuracies, the actual termination distance of polysilicon layer 12 is 2.6 mm. Likewise, prior art fabrication processes would intend for BPSG layer 14 to have a termination distance of 2.8 mm. However, due to placement inaccuracies, the actual termination distance of BPSG layer 14 is 3.0 mm. Furthermore, due to variances between the different edge bead removal units used in defining the termination distances of polysilicon layer 12 and BPSG layer 14, the termination distances of the two layers varies by 0.4 mm. Although the example of prior art fabrication processes shown in Prior Art FIG. 1A recites placement inaccuracies of 0.2 mm and a total variance of 0.4 mm, it will be understood by those of ordinary skill in the art that placement inaccuracies and total variances can differ significantly. Furthermore, although the example of prior art fabrication processes shown in Prior Art FIG. 1A recites a silicon wafer 10, a polysilicon layer 12, and a BPSG layer 14, it will be understood by those of ordinary skill in the art that such placement inaccuracies and variances will affect numerous other substrate layers and materials as well.

Figure 1B:
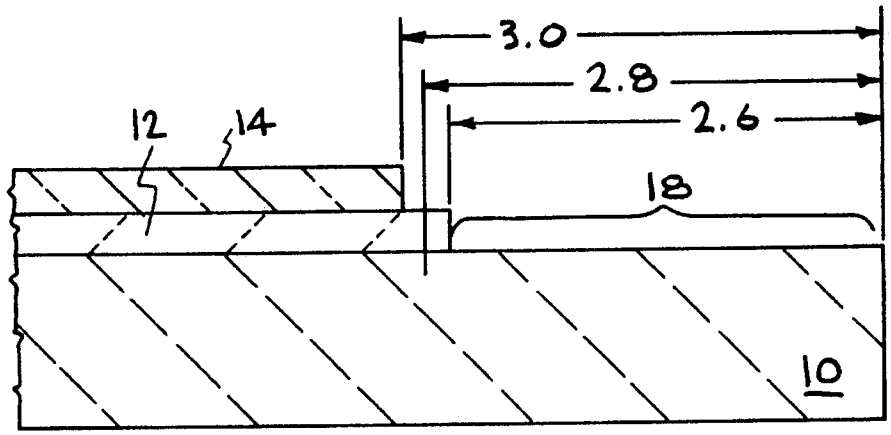
Figure 1C:
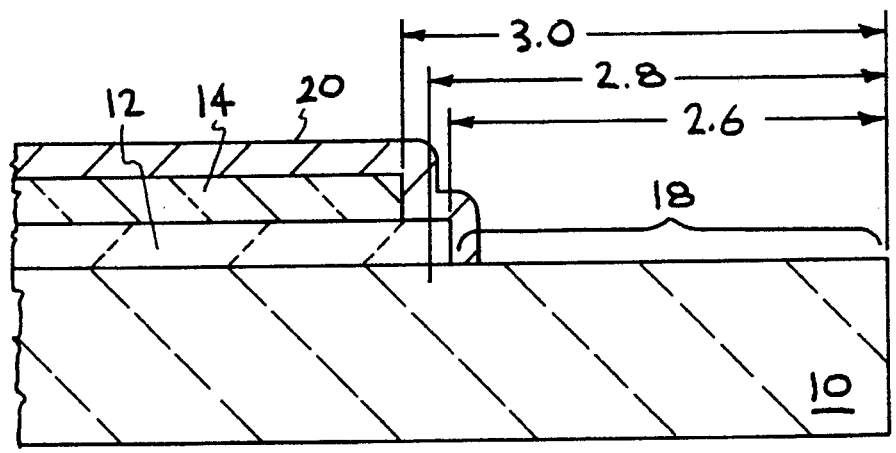

With reference next to Prior Art FIGS. 1B and 1C, after platinum layer 16 is removed in a strip, a region 18 of platinum silicide is formed. It is understood by those of ordinary skill in the art, that the termination distance of subsequent metal layers should be chosen such that the metal layers do not contact region 18. However, as shown in Prior Art FIG. 1C, placement inaccuracies and variances cause metal layer 20 to be deposited such that a portion of metal layer 20 is in contact with region 18.

Figure 1D:
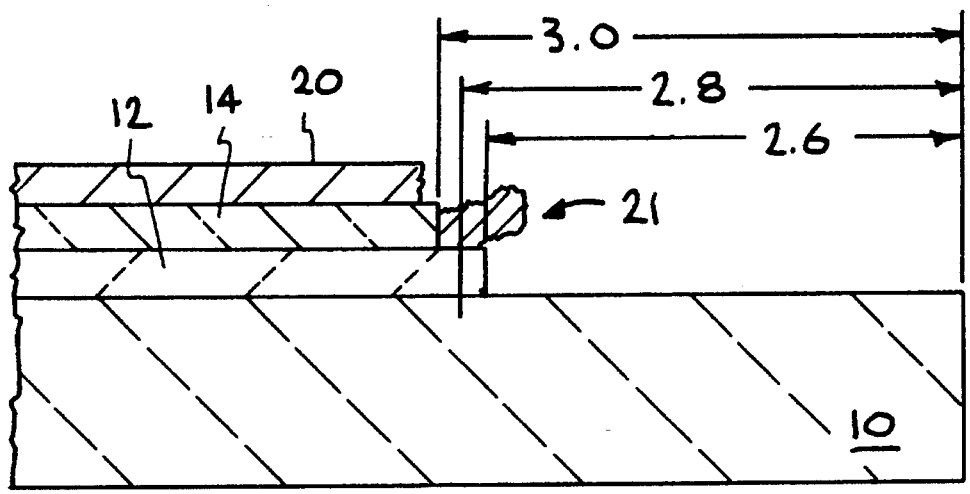

With reference next to Prior Art FIG. 1D metal layer 20 is undercut during subsequent etching processes. As a result, portion 21 of metal layer 20 flakes off and potentially redeposits onto the top of substrate layers stacked on silicon wafer 10. The redeposition of portion 21 causes defects in integrated circuit devices fabricated on silicon wafer 10 and decreases device yield. Thus, the random and haphazard stacking of substrate layers found in the prior art results in edge-related defects which contaminates the semiconductor wafer and causes defects in the integrated circuit devices formed on the semiconductor wafer. Although only one example of an edge-related defect is illustrated in Prior Art FIGS. 1A–1D, it will be understood by those of ordinary skill in the art that numerous other types of edge-related defects result from the random and haphazard stacking of substrate layers found in the prior art.

With reference now to FIGS. 2A–2J, cross sectional views illustrating ordered and structured stacking of substrate layers in accordance with the present claimed invention are shown. In the present invention, the precise location at which each of multiple processing units performs a process is determined. That is, a location is selected for the performance of a process with respect to the edge of a semiconductor wafer. After the process is performed, the semiconductor wafer is examined to determine the actual location at which the process is performed. The actual location of the process is compared with the selected location for the process to determine the placement inaccuracy of each of the multiple processing units. Once the placement inaccuracy of each of the multiple processing units is determined, each of the multiple processing units are calibrated. By calibrating each of the multiple processing units, the actual location with respect to the edge of the semiconductor wafer for the performance of a process is the same as the selected location for the performance of the process. Additionally, because the each of the multiple process units are calibrated with respect to the edge of the semiconductor wafer, variances between multiple processing units are also eliminated. In the present embodiment, the multiple process units are edge bead removal units. Furthermore, the present invention is well suited to use with multiple chemical edge bead removal units, multiple optical edge bead removal units, or a combination of multiple chemical and optical edge bead removal units.

The present invention is also well suited to monitoring the multiple process units and periodically checking the units to insure that the placement inaccuracies are eliminated. In so doing, the present invention insures that each of the multiple process units is equally referenced with respect to the edge of the semiconductor wafer.

Figure 2A:
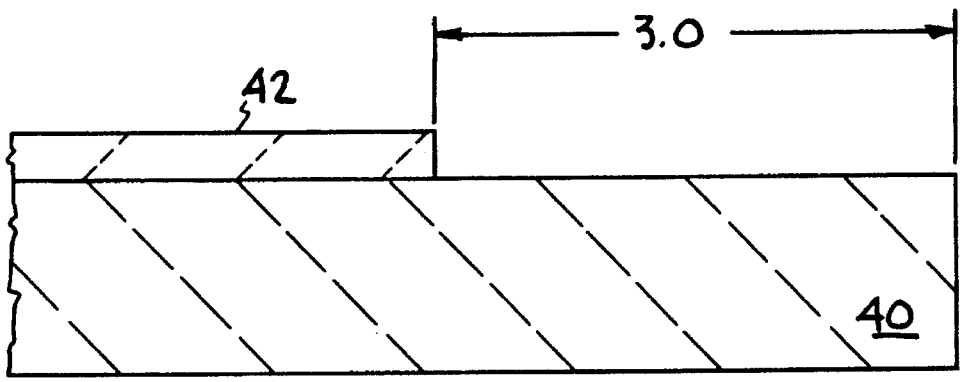
FIGS. 2A–2J are cross sectional views illustrating ordered and structured stacking of substrate layers in accordance with the present claimed invention.

With reference now to FIG. 2A, a silicon wafer 40 has a polysilicon layer 42 stacked thereon. Due to the calibration step employed in the present invention, the termination distance of polysilicon layer 42 is at 3.0 mm as desired in the present embodiment. That is, by calibrating the edge bead removal unit used to define the termination distance of polysilicon layer 42, the present invention eliminates placement inaccuracies found in the prior art.

Figure 2B:
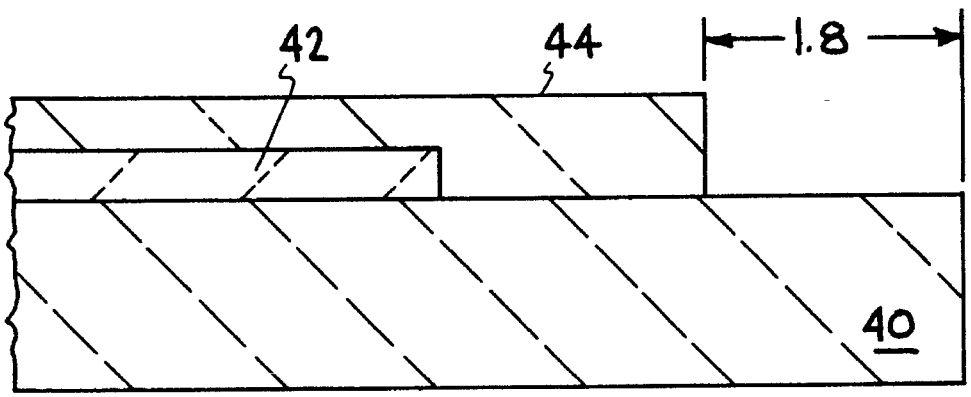

With reference next to FIG. 2B, a BPSG layer 44 is deposited over polysilicon layer 42. As shown in FIG. 2B, in the present embodiment, layer 44 has a desired and actual termination distance of 1.8 mm in the present embodiment. As stated above, typically several edge bead removal units are used to define the termination distance of the substrate layers. Therefore, different edge bead removal units are used to define layers 42 and 44. However, due to the above-described calibration performed in accordance with the present invention, placement inaccuracies and variances between different edge bead removal units are eliminated. Thus, each of layers 42 and 44 are placed as desired with respect to the edge of semiconductor wafer 40.

Figure 2C:
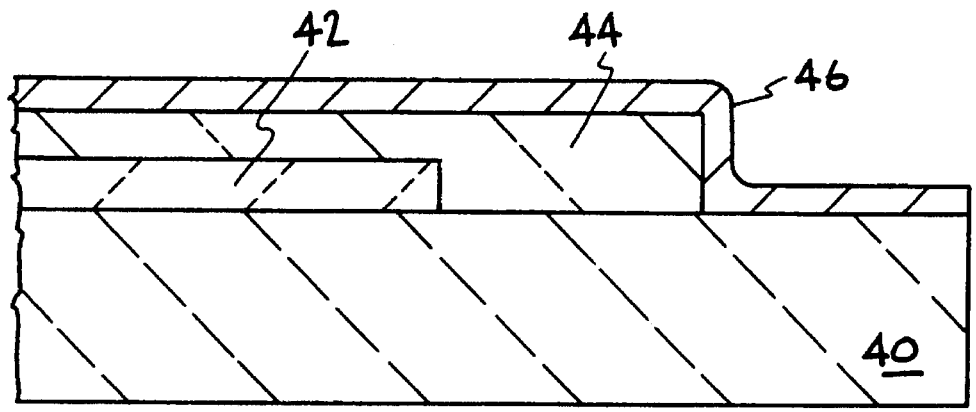
Figure 2D:
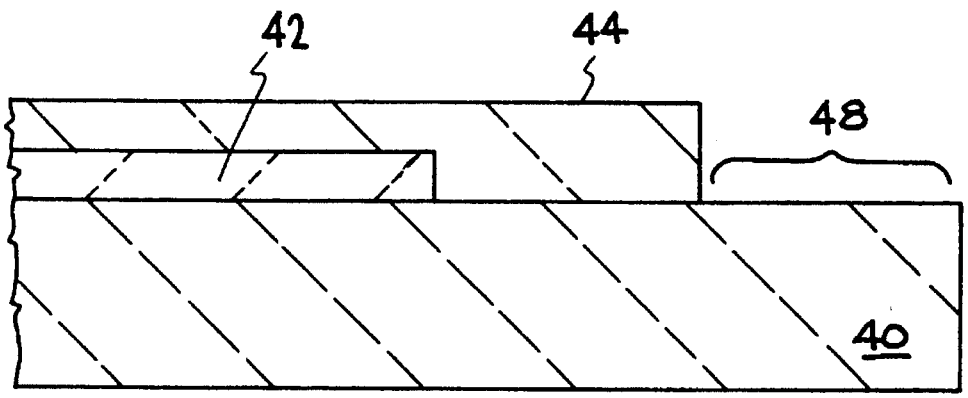

Referring now to FIGS. 2C and 2D, a platinum layer 46 is deposited as shown. Next, platinum layer 46 is removed.

As shown in FIG. 2D, a region 48 of platinum silicide is formed where layer 46 previously contacted the uncovered portion of semiconductor wafer 40.

Figure 2E:
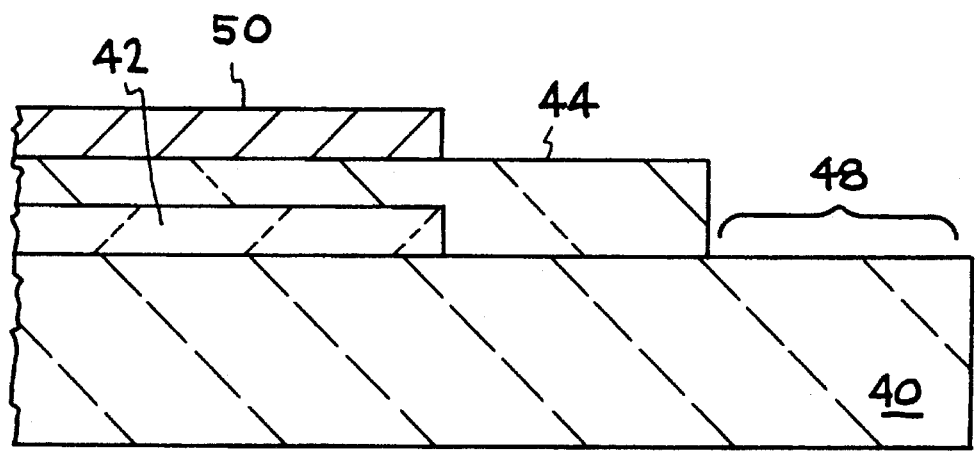

With reference next to FIG. 2E, a metal layer 50 is deposited over BPSG layer 44. In the present embodiment, the termination distance of metal layer 50 is selected to be the same as the termination distance of polysilicon layer 42. As mentioned above, it is understood by those of ordinary skill in the art, that the termination distance of subsequent metal layers should be chosen such that the metal layers do not contact a platinum silicide region such as region 48. Thus, by eliminating placement inaccuracies, the present invention prevents unwanted contact between subsequent metal layers and platinum silicide regions as found in prior art processes. As a result, metal layer 50 is not deleteriously affected by subsequent etching processes. Therefore, the present invention eliminates harmful flaking and redeposition of portions of metal layers as found in the prior art. By eliminating harmful flaking and redeposition, the die per wafer yield is significantly improved by the present invention. More specifically, in repeated testing, the present invention achieves an average of 410 usable die per wafer whereas prior art processes produce an average of only 328 usable die per wafer.

Figure 2F:
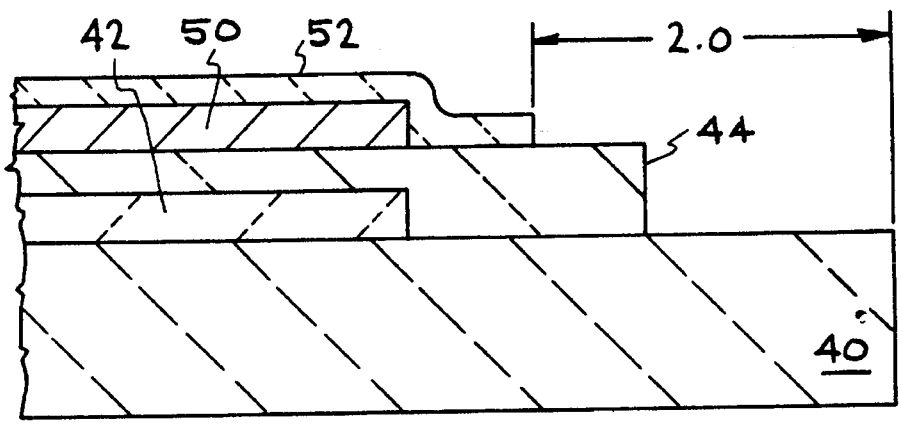

With reference next to FIG. 2F, an intermetal oxide (IMO) layer 52 is deposited over metal layer 50. As shown in FIG. 2F, IMO layer 52 has a termination distance of 2.0 mm. By extending IMO layer 52 to 2.0 mm from the edge of semiconductor wafer 40, a stepped or tiered arrangement of the substrate layers is achieved. The orderly tiered arrangement of the substrate layers prevents metal layer 50 from being undercut, insures that metal layer 50 is not deposited on a layer from which it would peel, and prevents metal layer 50 from being exposed to a detrimental etching operation. Furthermore, the orderly tiered arrangement of the present invention insures that metal layer 50 is completely sealed from the ambient. In so doing, the present invention eliminates defects associated with the prior art wherein portions of metal layers are often detrimentally exposed to the ambient.

Figure 2G:
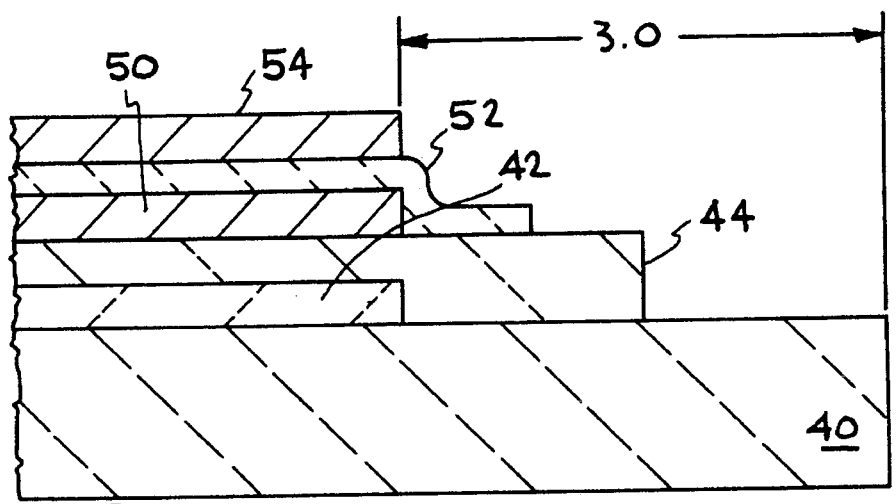

Referring now to FIG. 2G, a second metal layer 54 is deposited over IMO layer 52. In the present embodiment, the termination distance of metal layer 54 is selected to be the same as the termination distance of metal layer 50 and polysilicon layer 42, 3.0 mm. As mentioned above, by eliminating placement inaccuracies and variances between multiple edge bead removal units, the present invention allows metal layer 54 to be terminated wherever desired with respect to the edge of semiconductor wafer 40. Thus, the present invention prevents unwanted contact between subsequent metal layers and, for example, platinum silicide regions.

Figure 2H:
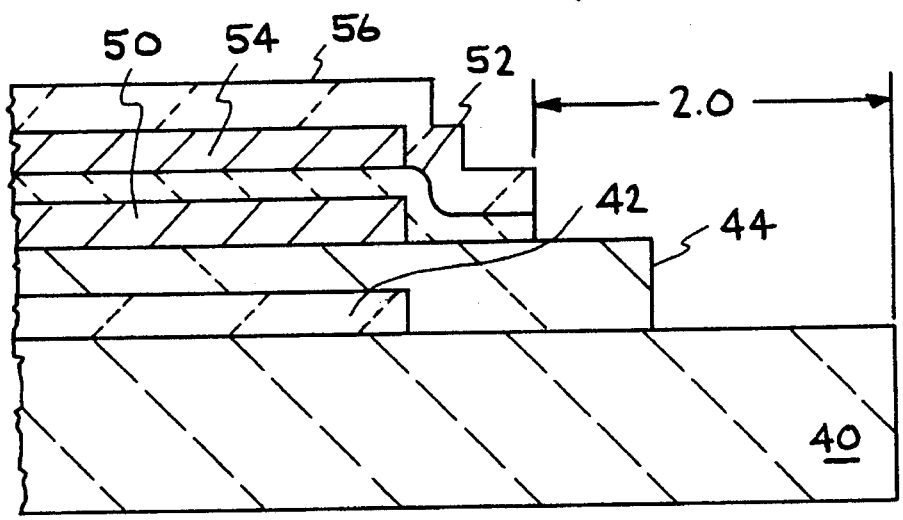

Referring now to FIG. 2H, an IMO layer 56 is deposited over metal layer 54. As shown in FIG. 2H, IMO layer 56 has a termination distance of 2.0 mm which is equal to the termination distance of IMO layer 52. Again, by extending IMO layer 56 to 2.0 mm from the edge of semiconductor wafer 40, a stepped or tiered arrangement of the substrate layers is achieved. The orderly tiered arrangement of the substrate layers prevents metal layer 54 from being undercut, insures that metal layer 54 is not deposited on a layer from which it would peel, and prevents metal layer 54 from being exposed to a detrimental etching operation. Furthermore, the orderly tiered arrangement of the present invention insures that metal layer 54 is completely sealed from the ambient. In so doing, the present invention eliminates defects associated with the prior art wherein portions of metal layers are often detrimentally exposed to the ambient.

Figure 2I:
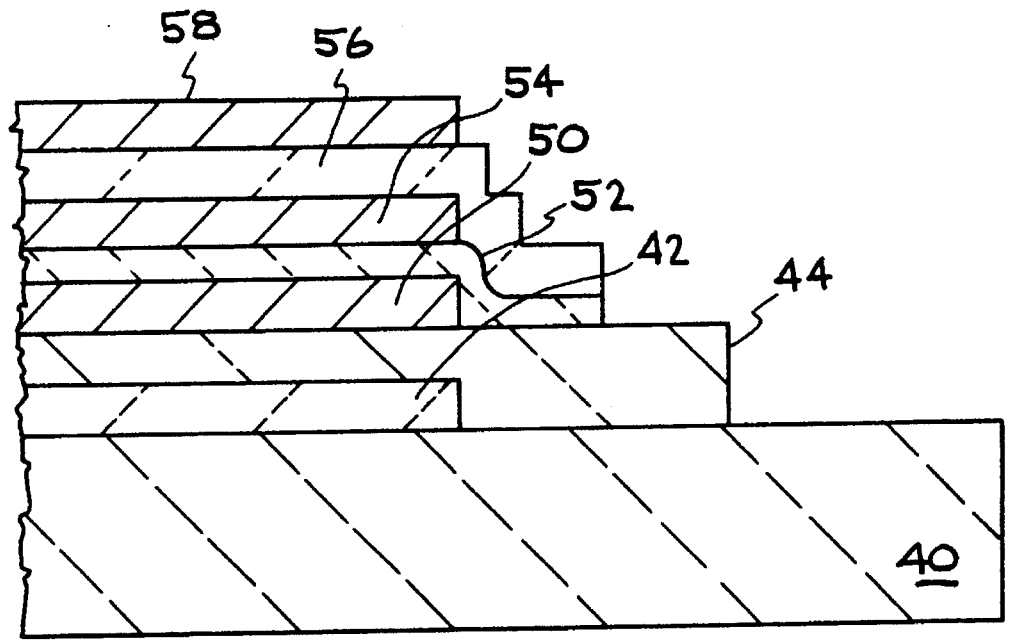

Referring now to FIG. 2I, a third metal layer 58 is deposited over IMO layer 56. In the present embodiment, the termination distance of metal layer 58 is selected to be 3.0 mm, the same as the termination distance of metal layers 54, 50, and polysilicon layer 42. As mentioned above, by eliminating placement inaccuracies and variances between multiple edge bead removal units, the present invention allows metal layer 58 to be terminated wherever desired with respect to the edge of semiconductor wafer 40.

Figure 2J:
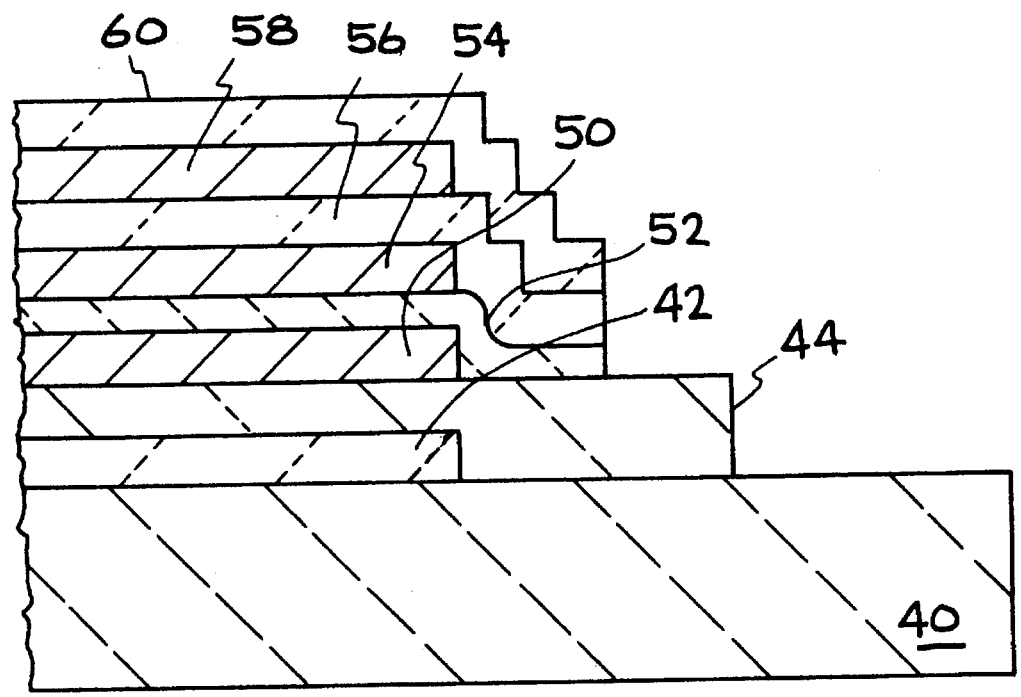

Referring now to FIG. 2J, an oxide passivation layer 60 is deposited over metal layer 58. As shown in FIG. 2J, oxide passivation layer 60 has a termination distance of 2.0 mm which is equal to the termination distance of IMO layers 54 and 52. Again, by extending oxide passivation layer 60 to 2.0 mm from the edge of semiconductor wafer 40, a stepped or tiered arrangement of the substrate layers is achieved. The orderly tiered arrangement of the substrate layers prevents metal layer 58 from being undercut, insures that metal layer 58 is not deposited on a layer from which it would peel, and prevents metal layer 58 from being exposed to a detrimental etching operation. Furthermore, the orderly tiered arrangement of the present invention insures that metal layer 58 is completely sealed from the ambient. In so doing, the present invention eliminates defects associated with the prior art wherein portions of metal layers are often detrimentally exposed to the ambient.

Although only one example of ordered or tiered stacking is illustrated in FIGS. 2A–2J, it will be understood by those of ordinary skill in the art that the present invention is well suited to numerous other ordered or tiered arrangements of substrate layers. Additionally, although certain specific termination distances are recited in the present embodiment, it will be understood by those of ordinary skill in the art that different termination distances can selected. Furthermore, although the present embodiment recites specific substrate layers and materials, it will be understood by those of ordinary skill in the art that the present invention is well suited to the use of other substrate layers and materials as well.

As an additional advantage the present invention also prevents contamination of semiconductor wafer clamping and handling equipment without significantly reducing semiconductor wafer real estate. Specifically, by eliminating placement inaccuracies associated with edge bead removal units, the present invention makes it possible to precisely remove photoresist from the edge portion of the semiconductor wafer contacted by clamps or other wafer handling equipment. That is, if the clamps or other wafer handling equipment will contact the portion of the semiconductor wafer extending from the edge of the wafer inward 1.8 mm, the present invention can precisely define the termination distance of the photoresist to be just greater than 1.8 mm. In so doing, no photoresist will remain on the portion of the semiconductor wafer contacted by clamps or other wafer handling equipment. Thus, unlike prior art processes which must remove the photoresist from a much larger portion of the semiconductor wafer to allow for placement inaccuracies of the edge bead removal units, the present invention only removes as much photoresist from the edge of the semiconductor wafer as is necessary. Therefore, the present invention increases the semiconductor wafer real estate available for the production of integrated circuit devices.

Thus, the present invention provides a method or process which allows for an orderly arrangement of substrate layers at or near the edge of a semiconductor wafer thereby preventing undercutting of deposited substrate layers, preventing exposure of the deposited substrate layers to unwanted etching operations, and protectively sealing of the edges of certain deposited substrate layers from the ambient. The present invention further provides a method or process which prevents unwanted photoresist contamination of semiconductor wafer clamping and handling equipment without significantly reducing semiconductor wafer real estate.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method for reducing semiconductor wafer edge-related defects comprising the steps of:

calibrating multiple process units such that said multiple process units are equally referenced with respect to an edge of a semiconductor wafer;

utilizing said calibrated multiple process units to precisely control respective termination distances of deposited substrate layers with respect to said edge of said semiconductor wafer; and selectively stacking said deposited substrate layers such that semiconductor wafer edge-related defects are prevented.

2. The method as recited in claim 1 wherein said step of calibrating multiple process units further comprises the step of:

determining for each of said multiple process units the difference between a location selected for the performance of a process with respect to said edge of said semiconductor wafer and the actual location at which said process is performed with respect to said edge of said semiconductor wafer.

3. The method as recited in claim 1 wherein said step of calibrating multiple process units further comprises the step of:

calibrating multiple chemical edge bead removal units such that said chemical edge bead removal units are equally referenced with respect to said edge of said semiconductor wafer.

4. The method as recited in claim 1 wherein said step of calibrating multiple process units further comprises the step of:

calibrating multiple edge expose wafer units such that said multiple edge expose wafer units are equally referenced with respect to said edge of said semiconductor wafer.

5. The method as recited in claim 1 wherein said step of calibrating multiple process units further comprises the step of:

calibrating at least one chemical edge bead removal unit and at least one edge expose wafer unit such that said at least one chemical edge bead removal unit and said at least one edge expose wafer unit are equally referenced with respect to said edge of said semiconductor wafer.

6. The method as recited in claim 1 wherein said step of utilizing said calibrated multiple process units to precisely control respective termination distances of deposited substrate layers further comprises the step of:

removing photoresist material which is disposed on said deposited substrate layers such that said photoresist material is removed from respective said deposited substrate layers a precise specified distance from said edge of said semiconductor wafer.

7. The method as recited in claim 1 wherein said step of selectively stacking said deposited substrate layers such that semiconductor wafer edge-related defects are prevented further comprises the step of:

stacking said deposited substrate layers to prevent undercutting of said deposited substrate layers during processing operations.

8. The method as recited in claim 1 wherein said step of selectively stacking said deposited substrate layers such that semiconductor wafer edge-related defects are prevented further comprises the step of:

stacking said deposited substrate layers to prevent exposing said deposited substrate layers to unwanted etching operations.

9. The method as recited in claim 1 wherein said step of selectively stacking said deposited substrate layers such that semiconductor wafer edge-related defects are prevented further comprises the step of:

stacking said deposited substrate layers to prevent peeling of said deposited substrate layers.

10. The method as recited in claim 1 wherein said step of selectively stacking said deposited substrate layers such that semiconductor wafer edge-related defects are prevented further comprises the step of:

stacking said deposited substrate layers to protectively seal edges of certain of said deposited substrate layers from the ambient.

11. A method for reducing semiconductor wafer edge-related defects comprising the steps of:

determining for each of multiple process units the difference between a location selected for the performance of a process with respect to an edge of a semiconductor wafer and the actual location at which said process is performed with respect to said edge of said semiconductor wafer;

calibrating said multiple process units such that processes performed by said multiple process units are equally referenced with respect to an edge of said semiconductor wafer;

utilizing said calibrated multiple process units to precisely control respective termination distances of deposited substrate layers with respect to said edge of said semiconductor substrate;

selectively stacking said deposited substrate layers such that semiconductor wafer edge-related defects are prevented; and monitoring said difference between a location selected for the performance of a process with respect to an edge of said semiconductor wafer and the actual location at which said process is performed with respect to said edge of said semiconductor wafer.

12. The method as recited in claim 11 wherein said step of calibrating multiple process units further comprises the step of:

calibrating multiple chemical edge bead removal units such that said chemical edge bead removal units are equally referenced with respect to said edge of said semiconductor wafer.

13. The method as recited in claim 11 wherein said step of calibrating multiple process units further comprises the step of:

calibrating multiple edge expose wafer units such that said multiple edge expose wafer units are equally referenced with respect to said edge of said semiconductor wafer.

14. The method as recited in claim 11 wherein said step of calibrating multiple process units further comprises the step of:

calibrating at least one chemical edge bead removal unit and at least one edge expose wafer unit such that said at least one chemical edge bead removal unit and said at least one edge expose wafer unit are equally referenced with respect to said edge of said semiconductor wafer.

15. The method as recited in claim 11 wherein said step of utilizing said calibrated multiple process units to precisely control respective termination distances of deposited substrate layers further comprises the step of:

removing photoresist material which is disposed on said deposited substrate layers such that said photoresist material is removed from respective said deposited substrate layers a precise specified distance from said edge of said semiconductor wafer.

16. The method as recited in claim 11 wherein said step of selectively stacking said deposited substrate layers such that semiconductor wafer edge-related defects are prevented further comprises the step of:

stacking said deposited substrate layers to prevent undercutting of said deposited substrate layers during processing operations.

17. The method as recited in claim 11 wherein said step of selectively stacking said deposited substrate layers such that semiconductor wafer edge-related defects are prevented further comprises the step of:

stacking said deposited substrate layers to prevent exposing said deposited substrate layers to unwanted etching operations.

18. The method as recited in claim 11 wherein said step of selectively stacking said deposited substrate layers such that semiconductor wafer edge-related defects are prevented further comprises the step of:

stacking said deposited substrate layers to prevent peeling of said deposited substrate layers.

19. The method as recited in claim 11 wherein said step of selectively stacking said deposited substrate layers such that semiconductor wafer edge-related defects are prevented further comprises the step of:

stacking said deposited substrate layers to protectively seal edges of certain of said deposited substrate layers from the ambient.

20. A process for reducing semiconductor wafer edge-related defects comprising the steps of:

determining for each of multiple edge bead removal units the difference between a location selected for the removal of photoresist with respect to an edge of a semiconductor wafer and the actual location at which said photoresist is removed with respect to said edge of said semiconductor wafer;

calibrating said multiple edge bead removal units such that photoresist removal processes performed by said multiple edge bead removal units are equally referenced with respect to an edge of said semiconductor wafer;

utilizing said calibrated multiple edge bead removal units to precisely control respective termination distances of deposited substrate layers with respect to said edge of said semiconductor substrate;

selectively stacking said deposited substrate layers such that semiconductor wafer edge-related defects are prevented; and monitoring said difference between a location selected for the performance of the removal of photoresist with respect to an edge of said semiconductor wafer and the actual location at which said photoresist is removed with respect to said edge of said semiconductor wafer.

* * * * *